United States Patent
Kwean

(10) Patent No.: US 8,045,397 B2
(45) Date of Patent: Oct. 25, 2011

(54) SEMICONDUCTOR MEMORY DEVICE HAVING COMMON CIRCUITRY FOR CONTROLLING ADDRESS AND DATA MASK INFORMATION

(75) Inventor: Ki-Chang Kwean, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 848 days.

(21) Appl. No.: 11/967,587

(22) Filed: Dec. 31, 2007

(65) Prior Publication Data

US 2009/0006731 A1 Jan. 1, 2009

(30) Foreign Application Priority Data

Jun. 26, 2007 (KR) .................. 10-2007-0063314

(51) Int. Cl.
*G11C 7/10* (2006.01)
(52) U.S. Cl. .............. 365/189.05; 365/189.12; 365/191; 365/230.08
(58) Field of Classification Search ............. 365/189.05, 365/189.12, 191, 230.08
See application file for complete search history.

(56) References Cited

U.S. PATENT DOCUMENTS

| | | | |
|---|---|---|---|
| 6,754,126 B2 * | 6/2004 | Yamaguchi et al. | 365/222 |
| 6,891,917 B2 * | 5/2005 | Chan et al. | 377/78 |
| 7,102,958 B2 | 9/2006 | Lee et al. | |
| 7,248,511 B2 | 7/2007 | Freebern | |
| 7,277,356 B2 | 10/2007 | Lee et al. | |
| 2003/0061460 A1 * | 3/2003 | Barth et al. | 711/167 |
| 2007/0073982 A1 | 3/2007 | Kim et al. | |
| 2008/0052474 A1 * | 2/2008 | Xu et al. | 711/154 |

FOREIGN PATENT DOCUMENTS

KR 1020030012812 2/2003

OTHER PUBLICATIONS

Qimonda GDDR5—White Paper. Aug. 2007. pp. 1-10.*
Notice of Allowance issued from Korean Intellectual Property Office on Dec. 16, 2008.

* cited by examiner

*Primary Examiner* — Alexander Sofocleous
(74) *Attorney, Agent, or Firm* — IP & T Group LLP

(57) ABSTRACT

A semiconductor memory device is capable of controlling an address and data mask information through the use of a common part, thereby reducing chip size. The semiconductor memory device for receiving the addresses and data mask information via a common pin includes a buffer unit and a shift register unit. The buffer unit receives the addresses and data mask information. The shift register unit is comprised of a plurality of latch stages connected in series, for sequentially latching the addresses and data mask information being inputted in series, and an address output unit and a data mask information output unit for outputting information from different latch stages.

16 Claims, 9 Drawing Sheets

US 8,045,397 B2

SEMICONDUCTOR MEMORY DEVICE HAVING COMMON CIRCUITRY FOR CONTROLLING ADDRESS AND DATA MASK INFORMATION

CROSS-REFERENCE TO RELATED APPLICATIONS

The present invention claims priority to Korean patent application number. 10-2007-0063314, filed on Jun. 26, 2007, which is incorporated by reference in its entirety.

BACKGROUND OF THE INVENTION

The invention relates to a semiconductor memory device and, more particularly, to processing on addresses and data mask information in the semiconductor memory device.

In conventional semiconductor memory devices, a pin is assigned separately for a data mask, and thus processing on addresses and data mask information has been carried out separately. FIG. 1 illustrates a block diagram of a part which receives and processes addresses in a conventional semiconductor memory device. The conventional semiconductor memory device includes a command buffer 101, a state machine 102, a write latency command unit 103, a clock buffer 104, an address buffer 105, an upward latch 106, an alignment unit 107, a downward latch 108, shift registers 109 and 110, and drivers 111 and 112.

In operation, commands are inputted to the command buffer 101 via a command (CMD) pin and addresses are applied to the address buffer 105 via an address pin. At this time, the addresses are inputted at both rising and falling edges of a clock. When a command is inputted to the state machine 102 through the command buffer 101, the state machine 102 recognizes that the inputted command is a command for write, and outputs a signal WCASP. In the meantime, an inputted address is latched by the upward latch 106 and the downward latch 108, respectively. An output of the upward latch 106 is aligned by the alignment unit 107 at the falling edge of the clock. In other words, addresses applied at the rising and falling edges of the clock are all aligned at the falling edge of the clock. The aligned addresses CA0 and CA1 are shifted by the shift registers 109 and 110. This is to synchronize the timing of a write latency (which is the time taken until receipt of data after a write command) with that of a write operation.

The signal WCASP is delayed by the write latency command unit 103 to generate an internal write signal IWT, which is a signal being enabled at the timing when a memory device writes data in a cell. And, addresses WCA0 and WCA1, which have been shifted and latched by the shift registers 109 and 110, are outputted, as addresses GAY0 and GAY1 indicative of global address Y, through the drivers 111 and 112 in synchronism with the internal write signal IWT.

FIG. 2 is a timing diagram illustrating the operation of the semiconductor memory device described in FIG. 1. When addresses A0 and A1 are inputted together with a write command WT, data Q0 to Q7 are applied after the write latency. The inputted addresses are aligned into addresses CA0 and CA1 by the latches 106 and 108 and the alignment unit 107 and then shifted to addresses WCA0 and WCA1 by the shift registers 109 and 110. Further, an internal write signal IWT is enabled at the timing when the memory device writes data in a memory cell, and addresses are outputted as the global addresses GAY0 and GAY1 through the drivers 111 and 112 in synchronism with the internal write signal IWT.

As indicated above, the conventional semiconductor memory device processes address information by using the configuration shown in FIG. 1, but processes data mask information in a different manner. Because the addresses and the data mask information are processed separately, a relatively large-sized circuit is required.

SUMMARY OF THE INVENTION

Embodiments of the present invention are directed to providing a semiconductor memory device capable of controlling address and data mask information through the use of a common part, thereby reducing chip size.

In one embodiment, a semiconductor memory device for receiving addresses and data mask information via a common pin includes a buffer unit configured to receive the addresses and data mask information; and a shift register unit, comprised of a plurality of latch stages connected in series and configured to sequentially latch the addresses and data mask information and an address output unit and a data mask information output unit configured to output information from different latch stages.

In another embodiment, a semiconductor memory device for receiving addresses and data mask information via a common pin includes a buffer unit configured to receive and align addresses and data mask information being inputted at rising and falling edges of a clock; a first shift register, comprised of a plurality of latch stages connected in series and configured to sequentially latch the addresses and the data mask information being inputted at the rising edge of the clock, and an address output unit and a data mask information output unit configured to output information of different latch stages; a second shift register configured to process the addresses and the data mask information being inputted at the falling edge of the clock; and a driving unit configured to output an output of each of the first and the second shift registers in synchronism with timing required for each of the addresses and the data mask information.

DESCRIPTION OF SPECIFIC EMBODIMENTS

A number of semiconductor memory devices have been developed, such as DDR, DDR2, GDDR3, and GDDR4.

Since GDDR5 semiconductor memory devices, a data mask pin for receiving data mask information is no longer used, and instead an address pin is used for the above purpose. As mentioned above, in the case where the semiconductor memory device accepts addresses and data mask information through a common pin, the present invention provides a scheme for controlling the addresses and data mask information through the use of a same part. Hereinafter, preferred embodiments of the present invention will be described in detail with reference to the accompanying drawings.

Figure 3:
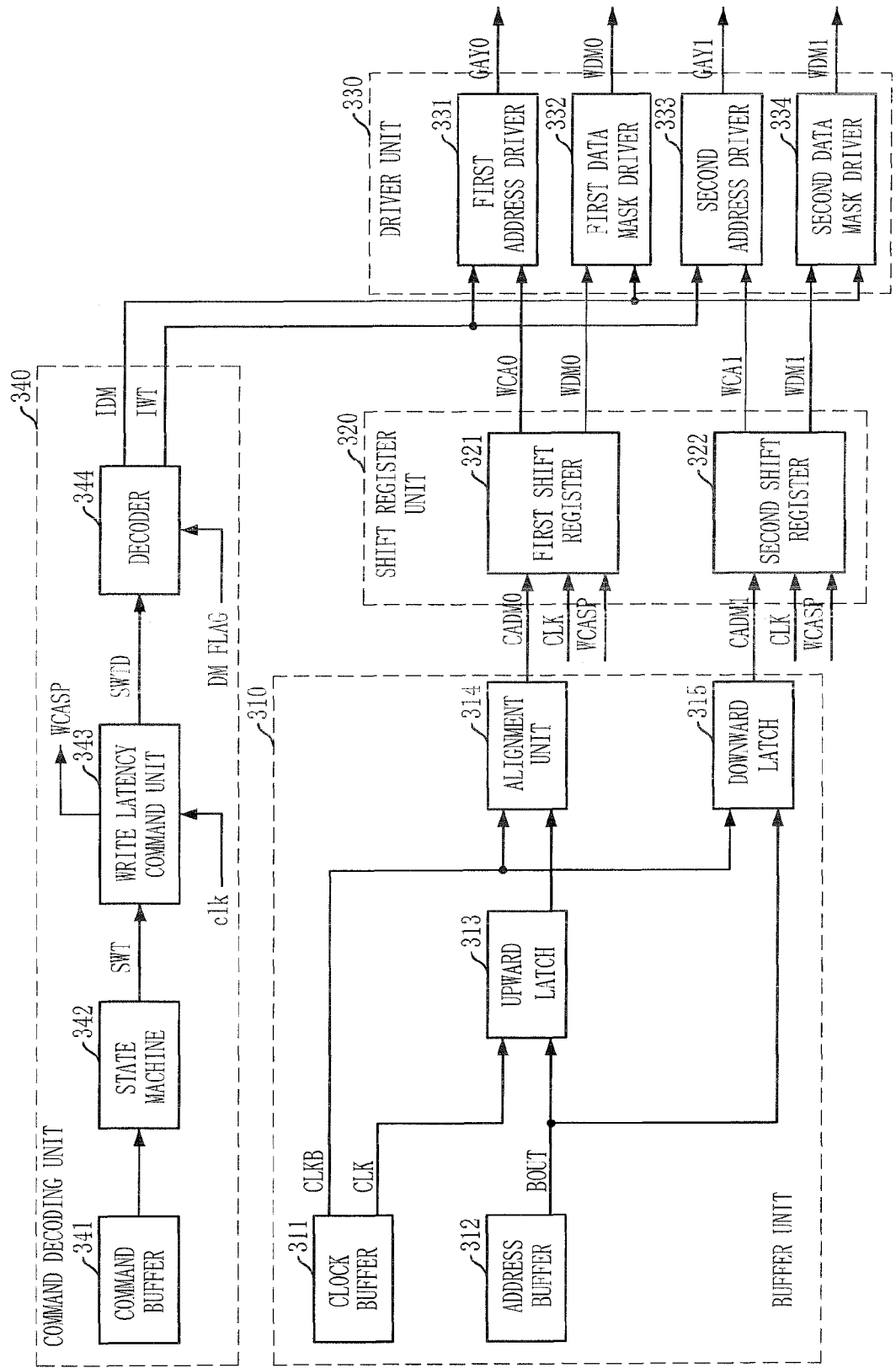
FIG. 3 illustrates a block diagram of a semiconductor memory device in accordance with a preferred embodiment of the present invention.

FIG. 3 is a block diagram of a semiconductor memory device in accordance with a preferred embodiment of the present invention. The semiconductor memory device of FIG. 3 includes a buffer unit 310 for taking addresses and data mask information and a shift register unit 320. The shift register unit 320 is comprised of a plurality of latch stages connected in series for sequentially latching the addresses and the data mask information being inputted in serially, and is provided with an address output unit WCA and a data mask information output unit WDM for outputting information from different latch stages, so that the addresses and the data mask information may be processed.

In addition, the semiconductor memory device of FIG. 3 further includes a command decoding unit 340 for decoding a command provided from outside to provide an internal write signal IWT and an internal data mask signal IDM, and a driver unit 330 for outputting the addresses and data mask information from the shift register unit 320 at required timing, thereby processing the addresses and the data mask information.

Figure 1:
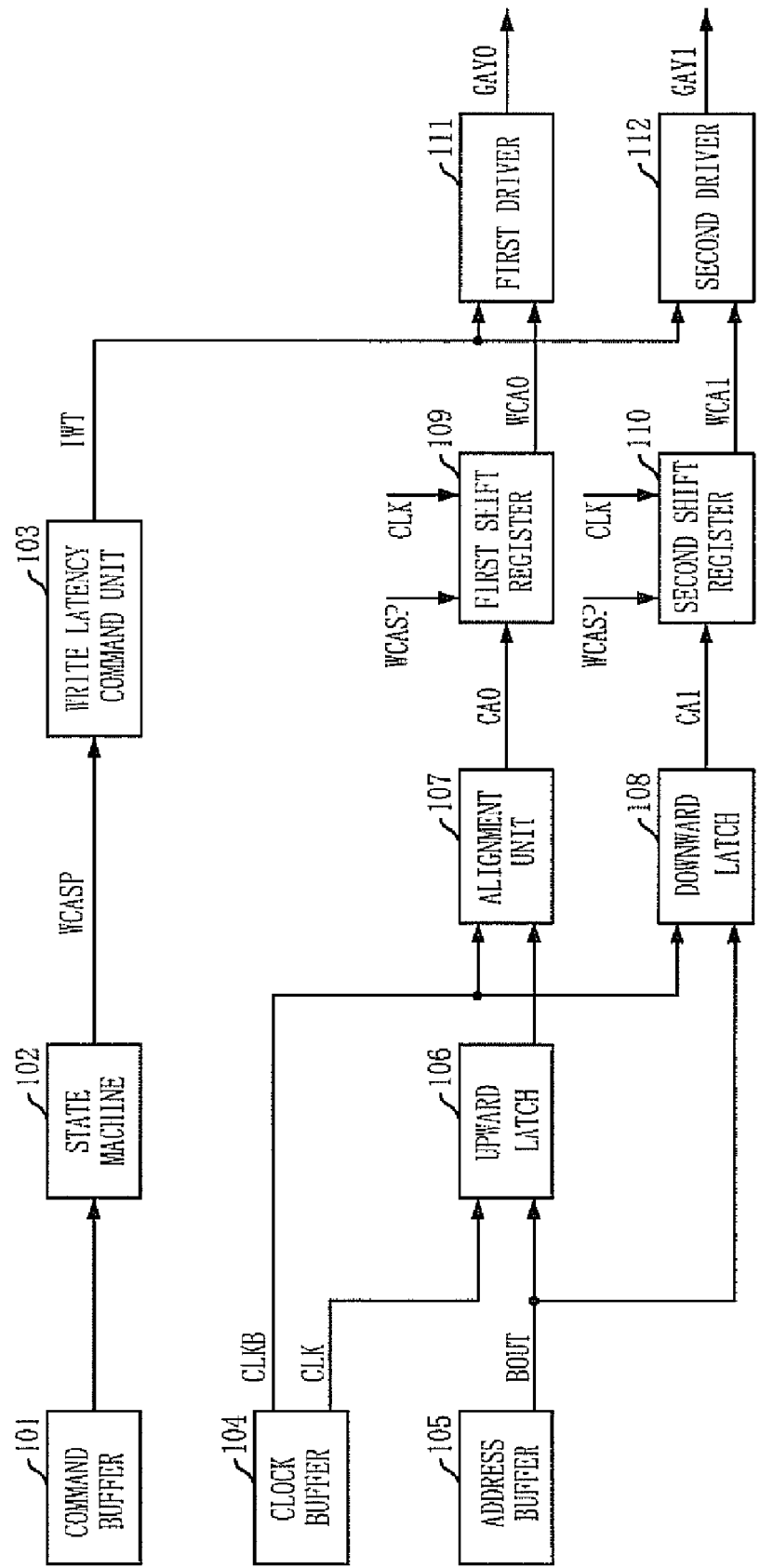
FIG. 1 illustrates a block diagram of a part that receives and processes addresses in a conventional semiconductor memory device.
Figure 2:
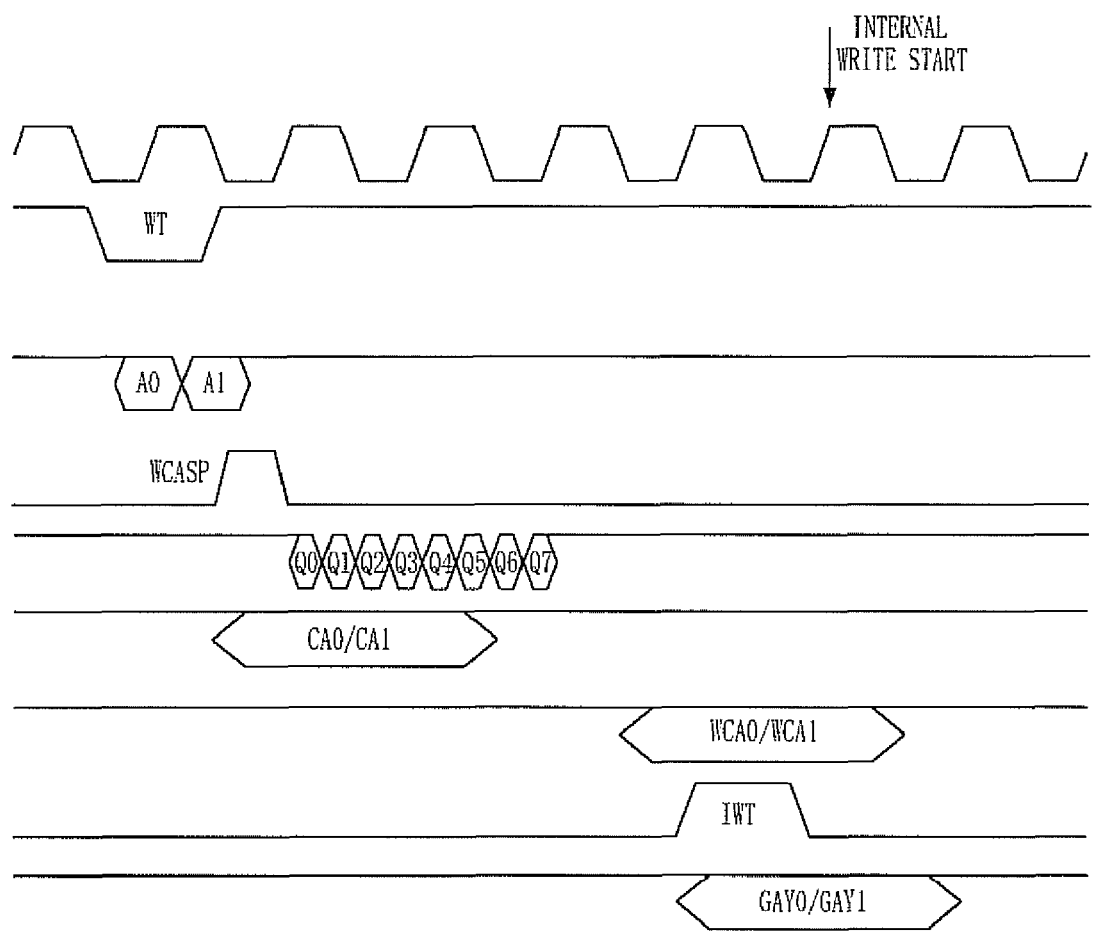
FIG. 2 is a timing diagram illustrating an operation of the semiconductor memory device shown in FIG. 1.

More specifically, the buffer unit 310 receives and aligns addresses and data mask information being inputted at rising and falling edges of a clock. This may be configured in the same fashion as in a conventional buffer unit (blocks 104 to 108 of FIG. 1) for receiving and aligning addresses. However, the present invention is applied to the memory device in which addresses and data mask information are inputted serially via the same pin, and therefore, one difference is that the addresses and data mask information are inputted and aligned through the buffer unit 310. Such a buffer unit 310 is comprised of an upward latch 313 for latching addresses and data mask information at the rising edge of a clock, a downward latch 315 for latching addresses and data mask information at the falling edge of the clock, and an alignment unit 314 for aligning the addresses and data mask information latched at the upward latch 313 and the downward latch 315, in addition to a clock buffer 311 and an address buffer 312.

The shift register unit 320, is comprised of a first shift register 321 for processing addresses and data mask information inputted from the rising edge of the clock and a second shift register 322 for processing addresses and data mask information inputted from the falling edge thereof.

In case address and data mask information are inputted serially via the same pin as in a GDDR5 memory device, a process in which one item of information is shifted by 3 and another item of information is shifted by 2 is performed during the process of shifting information inputted to one pin through the shift registers. In other words, where address and data mask information are inputted serially to the shift registers in the sequence of addresses and data mask information, and where the address is stored in the third latch stage, the data mask information will be stored in the second latch stage. Thus, an output of the third latch stage is used as the address and an output of the latch of second latch stage is used as the data mask information. The shift register unit 320 of FIG. 3 shifts the address and data mask information based on the above principle and outputs them as WCA and WDM separately. Details thereof will be given with reference to FIG. 5.

The command decoding unit 340 is comprised of a command buffer 341 for receiving commands, a state machine 342 for recognizing that a received command is a command for write to output a signal SWT, a write latency command unit 343 for delaying the signal SWT and providing a signal WCASP for controlling the enabling of the shift registers, and a decoder 344 for decoding a signal SWTD outputted from the write latency command unit and a data mask flag DM FLAG to generate an internal write signal IWT and an internal data mask signal IDM. In operation, when a command from outside is a command for write, a signal SWT is enabled and its delayed signal SWT and a data mask flag DM FLAG are combined to produce an internal write signal IWT and an internal data mask signal IDM. For reference, the data mask flag DM FLAG is a flag signal being enabled when the data mask information is inputted after address upon input of the write command. A detailed description of the command decoding unit 340 will be provided with reference to FIGS. 7 to 9.

The driving unit 330 outputs the addresses WACO and WCA1 and data mask information WDM0 and WDM1 being separately outputted from the shift register unit 320 in synchronism with a required timing (when write and data mask operations are actually done in the memory device). The driving unit 330 is comprised of address drivers 331 and 333 and data mask drivers 332 and 334. The address drivers 331 and 333 output addresses GAY0 and GAY1 in response to the internal write signal IWT and the data mask drivers 332 and 334 output data mask information WDM0 and WDM1 in response to the internal data mask signal IDM.

Figure 4:
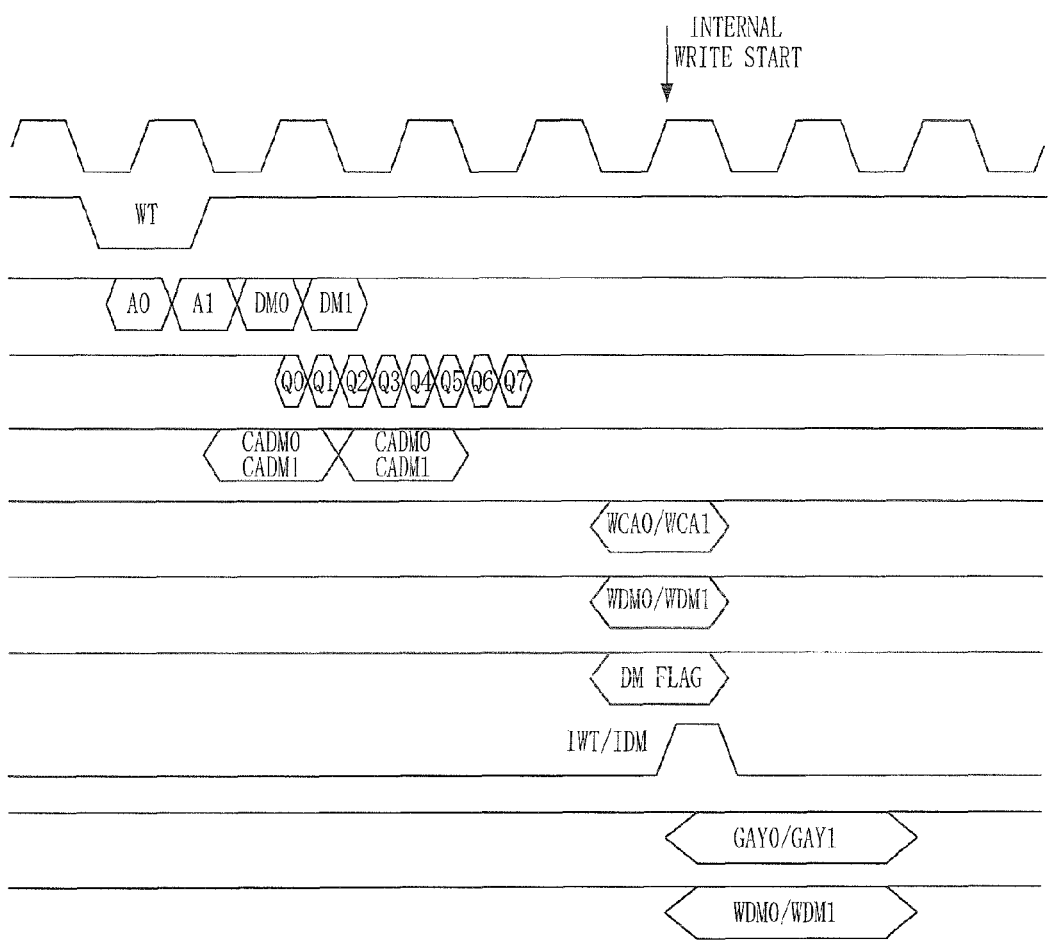
FIG. 4 is a timing diagram illustrating an operation of the semiconductor memory device shown in FIG. 3.

FIG. 4 is a timing diagram illustrating operation of the semiconductor memory device shown in FIG. 3. When a write command WT is inputted, addresses A0 and A1 and data mask information DM0 and DM1 are also serially inputted.

The addresses A0 and A1 and data mask information DM0 and DM1 serially inputted are aligned into CADM0 and CADM1 by the buffer unit 310 and then shifted by the shift register unit 320 to output addresses WCA0 and WCA1 and data mask information WDM0 WDM1 separately. The separated addresses WCA0 and WCA1 and data mask information WDM0 and WDM1 are outputted through the driving unit 330 in response to the internal write signal IWT or internal data mask signal IDM.

Figure 5:
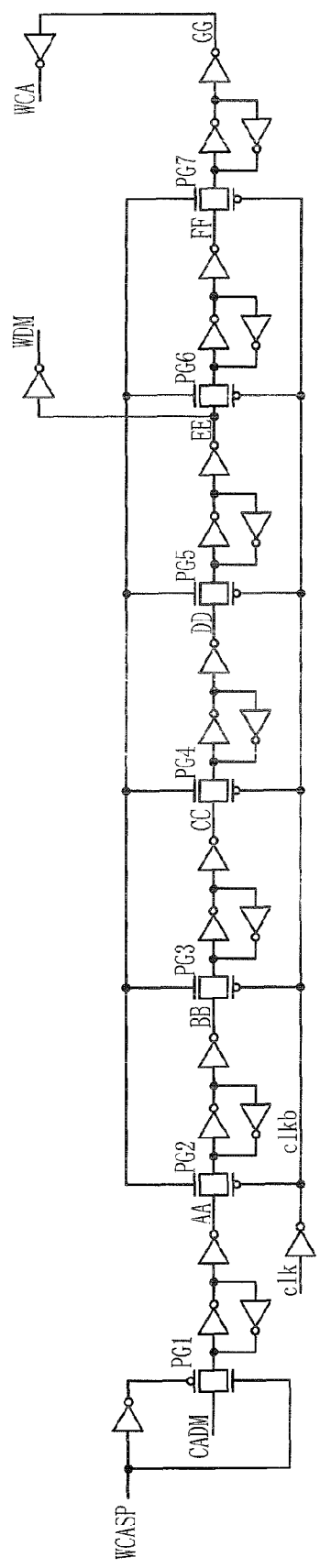
FIG. 5 illustrates a schematic circuit diagram of a shift register unit shown in FIG. 3.

FIG. 5 illustrates a schematic circuit diagram of the shift register unit 320 shown in FIG. 3. It should be noted that the first and the second shifter registers 321 and 322 included in the shift register unit 320 are identical to each other, except that their inputs are made at the rising edge or falling edge of the clock. Therefore, the shift register unit shown in FIG. 3 may be either the first shift register 321 or the second shift register 322.

As illustrated in FIG. 5, the shifter register unit is comprised of a plurality of latch stages connected in series for sequentially latching addresses and data mask information being inputted serially, and is provided with an address output unit WCA and a data mask information output unit WDM for outputting information of different latch stages. To be more specific, each of the plurality of latch stages is comprised of a pass gate PG which is turned on/off in response to clocks clk and clkb, and a latch for storing signals inputted to the pass gate PG.

The control of the first pass gate PG1 by a signal WCASP is to reduce current consumption by enabling the shifter register unit only for a predetermined period of time after receipt of a write command. The signal WCASP is provided from the command decoding unit and enabled only for a predetermined period of time after receipt of the write command.

Figure 6:
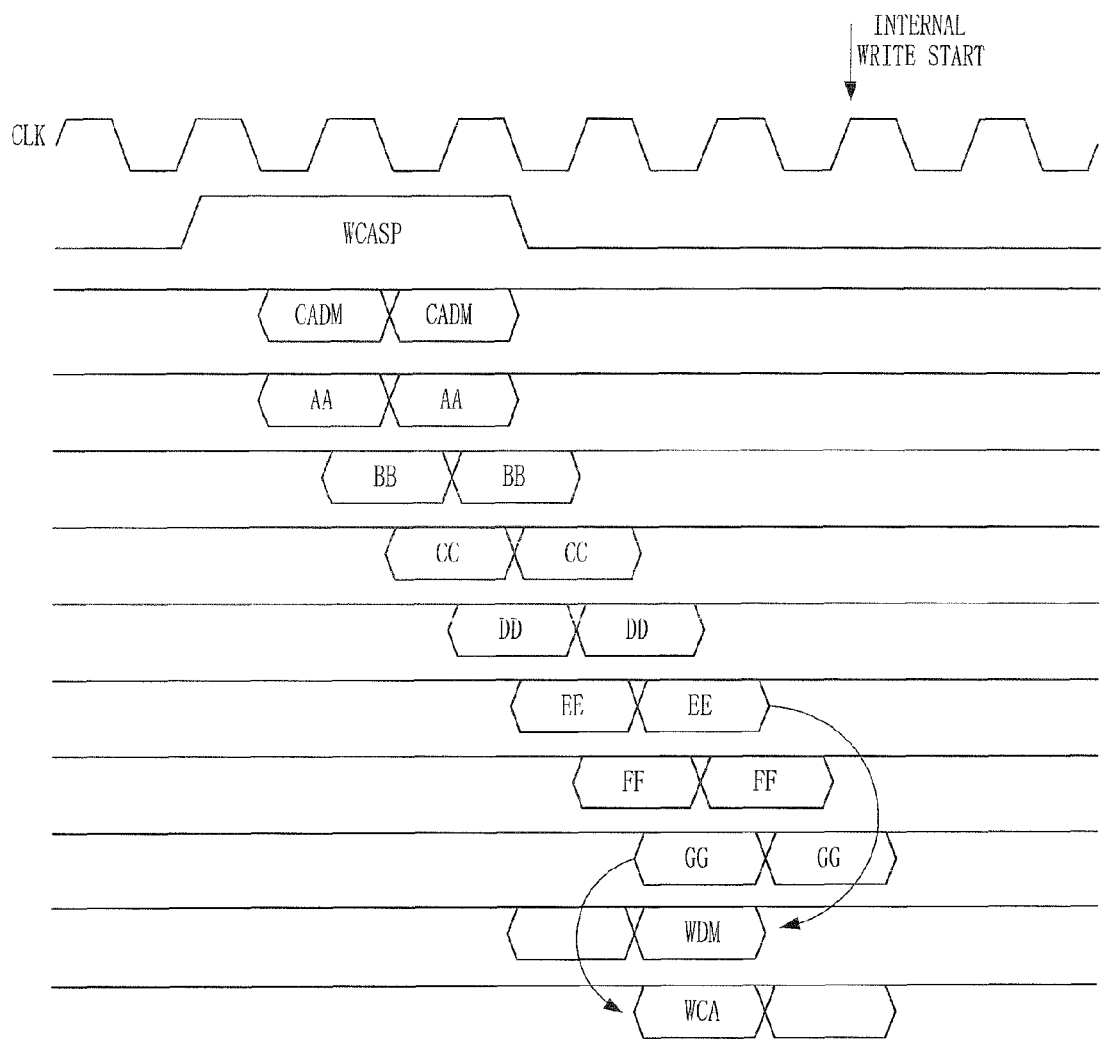
FIG. 6 is a timing diagram illustrating an operation of the shift register unit 320 shown in FIG. 5.

FIG. 6 is a timing diagram illustrating operation of the shift register unit 320 shown in FIG. 5. An aligned signal CADM inputted to the shift register unit of FIG. 5 is shifted to nodes AA, BB, and CC in sequence and information stored in a node EE is outputted as data mask information and information stored in a node GG is outputted as address. Data mask information or address to be actually used is a signal which is outputted when the internal write signal IWT and the internal data mask signal IDM are enabled at timing (internal write start in the drawing) when a write operation starts in the memory device. Thus, the right one of signals EE and the left one of signals GG in the timing diagram are used as data mask information and address, respectively. Accordingly, the signals WDM and WCA given at the lower end of the timing diagram exist at the same time become data mask information WDM and address WCA are outputted through the driving unit 330, respectively.

This may be illustrated by way of example. First, assuming that the shift register unit shown in FIG. 5 is the first shift register, the address A0 and the data mask information DM0 of FIG. 4 will be inputted to the shift register unit. At this time, the address A0 and the data mask information DM0 are inputted serially with one clock difference at the rising edge of the clock. Thus, the address A0 is outputted from the node GG of the shift register unit of FIG. 5 and the data mask information DM0 from the node EE thereof. The address A0 and the data mask information DM0 can be exactly outputted when the internal write signal IWT and the internal data mask signal IDM are enabled.

Figure 7:
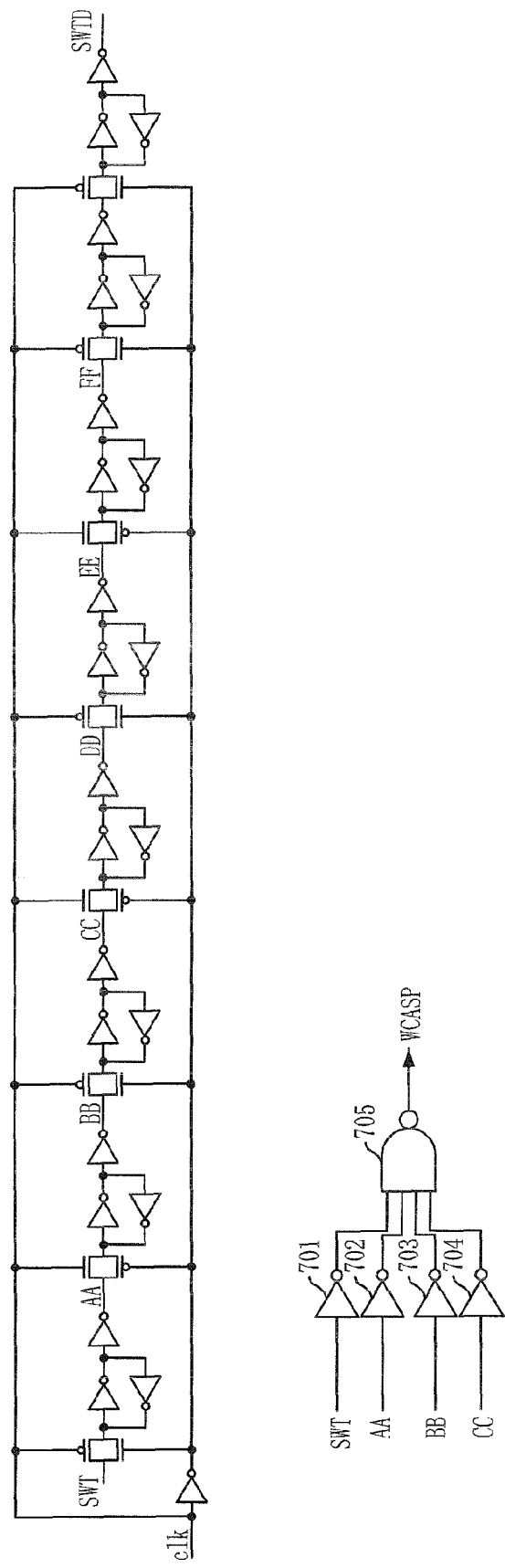
FIG. 7 illustrates a schematic circuit diagram of a write latency command unit shown in FIG. 3.
Figure 8:
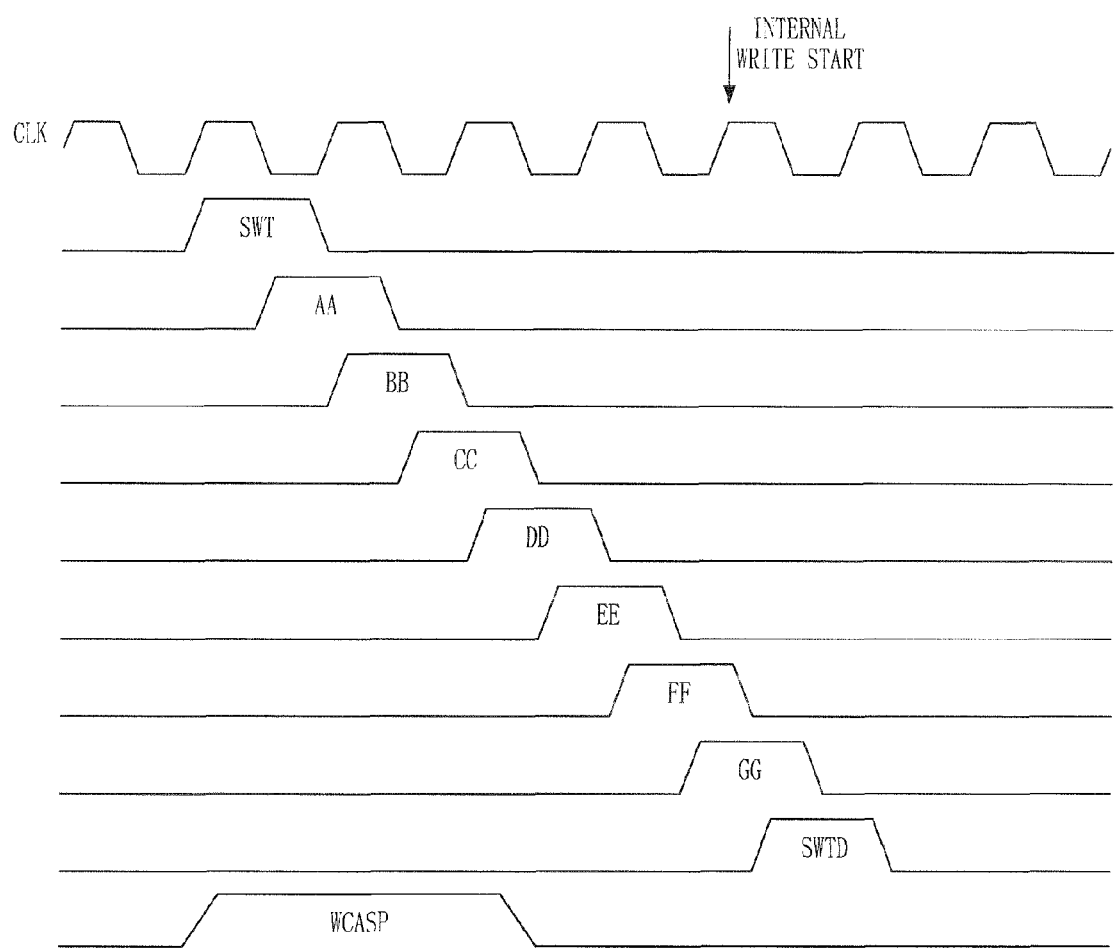
FIG. 8 is a timing diagram illustrating an operation of the write latency command unit shown in FIG. 7.

FIG. 7 illustrates a schematic circuit diagram of the write latency command unit 343 shown in FIG. 3. The write latency command unit is comprised of types of shift registers and output a signal SWTD by delaying a signal SWT outputted from the state machine 342 upon input of a write command. The write latency command unit 343 outputs a signal WCASP through inverters 701 to 704 and an NAND gate 705 provided at the lower end of FIG. 7. Here, the signal WCASP is enabled for a given period of time after input of the write command. Since the operation of the write latency command unit 343 is shown in the timing diagram of FIG. 8, details thereof will be omitted here.

The addresses and data mask information outputted from the shift register unit 320 FIG. 5 are aligned and outputted at the rising edge of the clock and the signal SWTD in FIG. 7 is aligned and outputted at the falling edge of the clock. This is to secure the timing margin of addresses and data mask information, and a signal for controlling these (where the signal SWTD becomes the internal data mask signal IDM or the internal write signal IWT to control the output time of addresses and data mask information).

Figure 9:
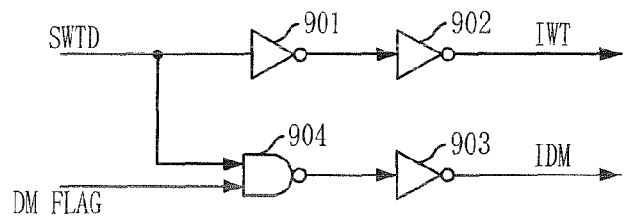
FIG. 9 illustrates a schematic circuit diagram of a decoder shown in FIG. 3.

FIG. 9 illustrates a schematic circuit diagram of the decoder 344 shown in FIG. 3. As shown in the drawing, the decoder 344 is comprised of inverters 901 to 903 and an NAND gate 904. In operation, an internal write signal IWT is enabled when the signal SWTD is enabled, and when both the signal SWTD and a data mask flag DM FLAG are enabled, an internal data mask signal IDM is enabled. As mentioned above, the data mask flag DM FLAG is a flag signal which is enabled when the data mask information is inputted after address upon input of a write command.

Figure 10:
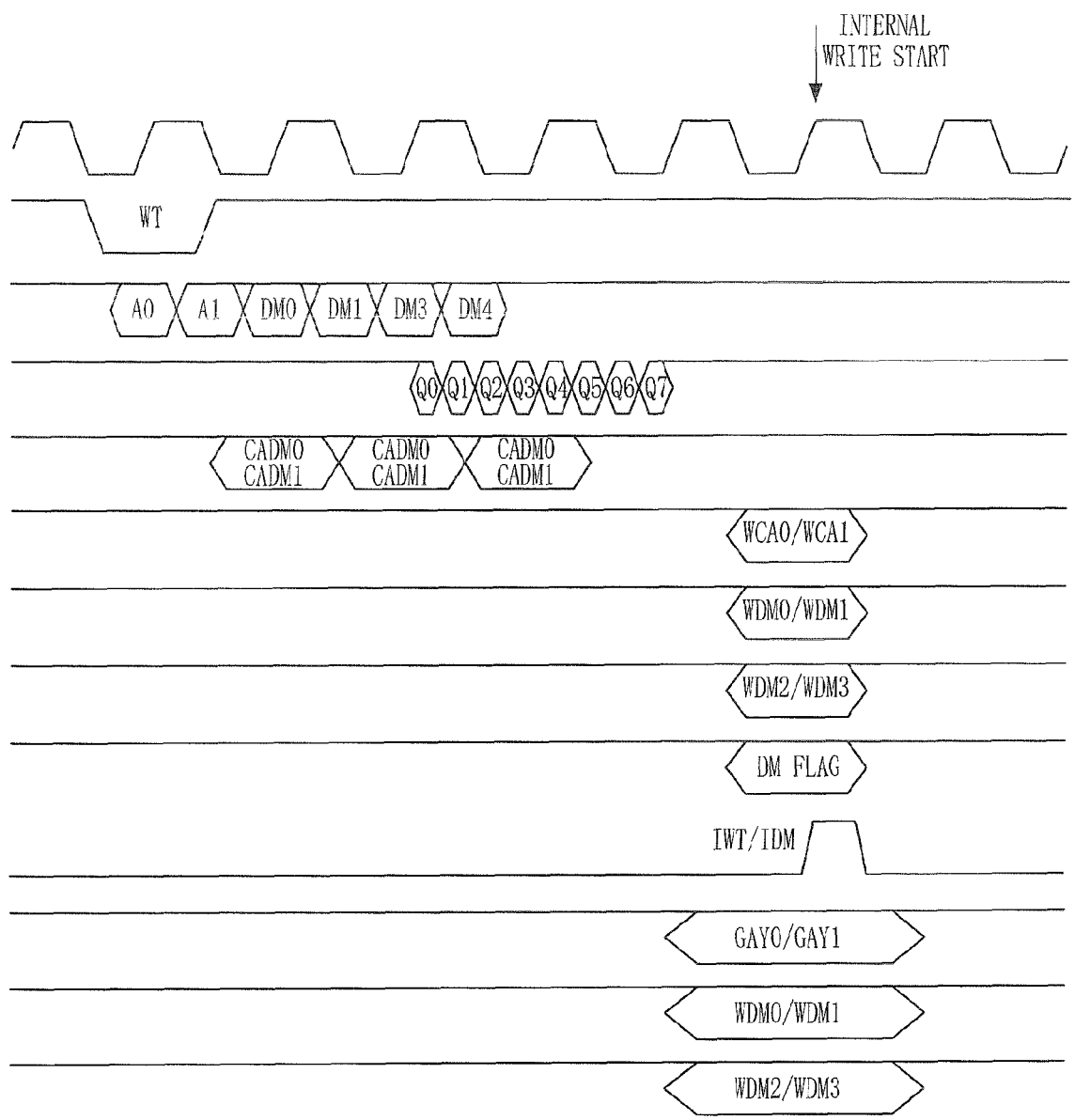
FIG. 10 is a timing diagram illustrating a case where four items of data mask information are inputted after addresses.

FIG. 10 is a timing diagram illustrating a situation where four items of data mask information are inputted after address. In this example, only a data mask information output unit is additionally provided at a node CC of the shifter register unit of FIG. 5.

As described above, the present invention provides a semiconductor memory device which controls addresses and data mask information by a common shift register unit. Thus, the present invention does not require an extra circuit for processing addresses and data mask information separately, thereby decreasing the entire size of the semiconductor memory device. In addition, since no extra circuit is required, current consumption can also be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device for receiving addresses and data mask information via a common pin, comprising:
   a buffer unit configured to receive the addresses and data mask information;
   a shift register unit, comprised of a plurality of latch stages connected in series and configured to sequentially latch the addresses and data mask information and an address output unit and a data mask information output unit configured to output information from different latch stages;
   a command decoding unit configured to decode a command from outside the semiconductor memory device to provide an internal write signal and an internal data mask signal;
   an address driver configured to output an address from the shift register unit in response to the internal write signal; and
   a data mask driver configured to output data mask information from the shift register init in response to the internal data mask signal.

2. The semiconductor memory device of claim 1, wherein the shift register unit comprises two shift registers, one shift register configured to process addresses and data mask information being inputted at a rising edge of a clock and the other shift register configured to process addresses and data mask information being inputted at a falling edge thereof.

3. The semiconductor memory device of claim 1, wherein the data mask information output unit is configured to output information of a latch stage and is shifted one clock period less than the address output unit.

4. The semiconductor memory device of claim 1, wherein the shift register unit performs control of write latency.

5. The semiconductor memory device of claim 1, wherein the shift register unit shifts the addresses and the data mask information in response to a clock.

6. The semiconductor memory device of claim 1, wherein the shift register unit is enabled for a predetermined period after receipt of a write command.

7. The semiconductor memory device of claim 1, wherein each of the plurality of latch stages in the shift register unit includes:
   a pass gate configured to turn on/off in response to a clock; and
   a latch configured to store signals to the pass gate.

8. The semiconductor memory device of claim 1, wherein the shift register unit includes at least two data mask information output units.

9. A semiconductor memory device for receiving addresses and data mask information via a common pin, comprising:
   a buffer unit configured to receive and align addresses and data mask information being inputted at rising and falling edges of a clock;
   a first shift register, comprised of latch stages connected in series and configured to sequentially latch the addresses and the data mask information being inputted at the rising edge of the clock and an address output unit and a data mask information output unit configured to output information of different ones of the latch stages;

a second shift register, including a data mask information output unit, configured to process the addresses and the data mask information being inputted at the falling edge of the clock;

a driving unit configured to output an output of each of the first and the second shift registers in synchronism with timing required for each of the addresses and the data mask information; and a command decoding unit configured to decode a command provided from outside to provide an internal write signal and an internal data mask signal, wherein the driving unit is configured to output the addresses in response to the internal write signal, and the data mask information in response to the internal data mask signal.

10. The semiconductor memory device of claim 9, wherein the data mask information output unit of each of the first and the second shift registers is configured to output information of one of the latch stages and is shifted one clock period less than the address output unit.

11. The semiconductor memory device of claim 9, wherein each of the first and the second shift registers is configured to shift the addresses and the data mask information in response to the clock.

12. The semiconductor memory device of claim 9, wherein each of the first and the second shift registers is enabled only for a predetermined period of time after receipt of a write command.

13. The semiconductor memory device of claim 9, wherein the command decoding unit is configured to output the internal write signal and the internal data mask signal in response to a write command and a data mask flag.

14. The semiconductor memory device of claim 9, wherein each of the plurality of latch stages in each of the first and the second shift registers includes:

a pass gate configured to turn on/off in response to the clock; and a latch configured to store signals to the pass gate.

15. The semiconductor memory device of claim 9, wherein the buffer unit includes:

an upward latch configured to latch the addresses and data mask information at the rising edge of the clock;

a downward latch configured to latch the addresses and data mask information at the falling edge of the clock; and an alignment unit configured to align the addresses and data mask information latched at the upward latch and the downward latch.

16. The semiconductor memory device of claim 9, wherein the first or second shift register includes at least two data mask information output units.

* * * * *